US012666740B2

(12) United States Patent (10) Patent No.: US 12,666,740 B2
Morimoto (45) Date of Patent: Jun. 23, 2026

(54) SOLID-STATE IMAGING DEVICE

(71) Applicant: SONY SEMICONDUCTOR SOLUTIONS CORPORATION, Kanagawa (JP)

(72) Inventor: Rui Morimoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 471 days.

(21) Appl. No.: 18/043,950

(22) PCT Filed: Aug. 10, 2021

(86) PCT No.: PCT/JP2021/029562
§ 371 (c)(1),
(2) Date: Mar. 3, 2023

(87) PCT Pub. No.: WO2022/054491
PCT Pub. Date: Mar. 17, 2022

(65) Prior Publication Data
US 2023/0326944 A1 Oct. 12, 2023

(30) Foreign Application Priority Data

Sep. 10, 2020 (JP) ................................. 2020-152365

(51) Int. Cl.
*H10F 39/00* (2025.01)
*H10F 39/12* (2025.01)
(52) U.S. Cl.
CPC ....... *H10F 39/8067* (2025.01); *H10F 39/199* (2025.01); *H10F 39/8063* (2025.01); *H10F 39/807* (2025.01); *H10F 39/811* (2025.01)
(58) Field of Classification Search
CPC .. H10F 39/8067; H10F 39/807; H10F 39/199; H10F 39/8063; H10F 39/811
See application file for complete search history.

(56) References Cited

U.S. PATENT DOCUMENTS 7,755,123 B2 * 7/2010 Dungan .............. H10F 39/8067
257/E31.127
7,982,177 B2 * 7/2011 Nozaki ................. H10F 39/806
257/436

(Continued)

FOREIGN PATENT DOCUMENTS

JP 2011-091128 5/2011
JP 2013-505587 2/2013

(Continued)

OTHER PUBLICATIONS

International Search Report and Written Opinion prepared by the Japan Patent Office on Oct. 15, 2021, for International Application No. PCT/JP2021/029562, 3 pgs.

*Primary Examiner* — David A Zarneke
(74) *Attorney, Agent, or Firm* — Sheridan Ross P.C.

(57) ABSTRACT

The present invention is a solid-state imaging device including: a semiconductor support substrate; a wiring layer formed on the semiconductor support substrate and including a predetermined metal wiring pattern; a photoelectric conversion layer provided on the wiring layer and including a plurality of photoelectric conversion elements that are formed in an array to generate charges by photoelectric conversion based on light incident on an incident surface; and a reflective structure disposed corresponding to each of the plurality of photoelectric conversion elements between the predetermined metal wiring pattern and the photoelectric conversion layer, the reflective structure having predetermined electromagnetic characteristics. Among the light incident on the photoelectric conversion layer, the reflective structure condenses and reflects light transmitted through each photoelectric conversion element of the photoelectric conversion layer at and to the photoelectric conversion element.

16 Claims, 10 Drawing Sheets

(56) References Cited

U.S. PATENT DOCUMENTS

| | | | | |
|---|---|---|---|---|
| 8,330,847 | B2 * | 12/2012 | Yamada | H10F 39/806 |
| | | | | 348/340 |
| 9,627,434 | B2 * | 4/2017 | Atwater | H10F 77/40 |
| 9,685,576 | B2 * | 6/2017 | Webster | H10F 39/807 |
| 10,957,731 | B1 * | 3/2021 | Hsieh | G01N 21/6486 |
| 11,114,488 | B1 * | 9/2021 | Lu | H10F 39/18 |
| 11,387,265 | B2 * | 7/2022 | Noudo | H04N 25/62 |
| 2011/0090384 | A1 | 4/2011 | Yamada | |
| 2011/0220971 | A1 | 9/2011 | Haddad et al. | |
| 2011/0227138 | A1 | 9/2011 | Haddad et al. | |
| 2014/0055655 | A1 | 2/2014 | Kokubun | |
| 2014/0197509 | A1 | 7/2014 | Haddad et al. | |
| 2015/0270306 | A1 | 9/2015 | Haddad et al. | |
| 2016/0048043 | A1 | 2/2016 | Palikaras et al. | |
| 2017/0271391 | A1 | 9/2017 | Haddad et al. | |
| 2018/0175093 | A1 | 6/2018 | Haddad et al. | |
| 2019/0280026 | A1 | 9/2019 | Takeuchi | |

FOREIGN PATENT DOCUMENTS

| | | |
|---|---|---|
| JP | 2014-027178 | 2/2014 |
| JP | 2014-041921 | 3/2014 |
| JP | 2016-517178 | 6/2016 |
| JP | 2019-091745 | 6/2019 |
| WO | WO 2018/092632 | 5/2018 |
| WO | WO 2019/102813 | 5/2019 |

* cited by examiner (a)

(b)

(c)

(a)

(b)

(a)

(b)

(a)

(b)

(c)

SOLID-STATE IMAGING DEVICE

CROSS REFERENCE TO RELATED APPLICATIONS

This application is a national stage application under 35 U.S.C. 371 and claims the benefit of PCT Application No. PCT/JP2021/029562, having an international filing date of 10 Aug. 2021, which designated the United States, which PCT application claimed the benefit of Japanese Patent Application No. 2020-152365, filed 10 Sep. 2020, the entire disclosures of each of which are incorporated herein by reference.

TECHNICAL FIELD

The present invention relates to a solid-state imaging device, and more particularly to an efficient photoelectric conversion technique in a backside illumination type solid-state imaging device.

BACKGROUND ART

A solid-state imaging device is a semiconductor device that uses photoelectric conversion elements, such as photodiodes, corresponding to pixels to convert the amounts of charges corresponding to the intensities of light focused on the pixels into electric signals. From the viewpoint of high utilization efficiency of incident light, a backside illumination type solid-state imaging device has attracted attention in which incident light reaches pixels directly.

Such a backside illumination type solid-state imaging device has a metal wiring layer disposed on the side opposite to the side of the photoelectric conversion layer including the photoelectric conversion elements irradiated with light from the outside. For this reason, part of the light incident on the photoelectric conversion layer is transmitted through the photoelectric conversion layer and reaches the metal wiring layer, where the light is reflected, causing the reflected light to enter adjacent pixels, causing so-called crosstalk. Such crosstalk causes deterioration of image quality such as reduction in resolution and color reproducibility, color mixture, and brightness difference. Accordingly, techniques for preventing the crosstalk have been proposed.

PTL 1 listed below discloses a technique for reducing the occurrence of crosstalk in a backside illumination type imaging element. Specifically, the imaging element disclosed in PTL 1 includes: a pixel including a photoelectric conversion unit, a pixel circuit, and a wiring layer; and a polarization unit. The photoelectric conversion unit is formed in a semiconductor substrate and performs photoelectric conversion of incident light. The pixel circuit generates an image signal corresponding to a charge generated by photoelectric conversion. The wiring layer is disposed on a surface of the semiconductor substrate different from a surface on which incident light is incident, and transmits an image signal or a signal applied to the pixel circuit. The polarization unit is disposed between the semiconductor substrate and the wiring layer to transmit light in a specific polarization direction among the incident light transmitted through the photoelectric conversion unit.

Further, PTL 2 listed below discloses a solid-state imaging element having a structure in which incident light transmitted through a substrate is reflected to a photoelectric conversion unit. Specifically, the solid-state imaging element disclosed in PTL 2 includes: the photoelectric conversion unit formed inside the substrate for each pixel; a light condenser provided on the side of the substrate on which incident light is incident to condense the incident light at the photoelectric conversion unit; and a reflector provided on the opposite side of the substrate from the light condenser and being concave toward the substrate.

CITATION LIST

Patent Literature

[PTL 1]
JP 2019-091745A
[PTL 2]
JP 2011-091128A

SUMMARY

Technical Problem

As described above, in the backside illumination type solid-state imaging device, part of the light transmitted through the photoelectric conversion layer reaches the metal wiring layer, where the light is reflected, causing crosstalk in which the reflected light enters adjacent pixels, resulting in deterioration of image quality such as reduction in resolution and color reproducibility, color mixture, and brightness difference. In particular, near-infrared (NIR) light having a wavelength of about 940 nm, for example, has a problem that the light is easily transmitted through the photoelectric conversion layer containing silicon (Si) as a main material and is reflected by the metal wiring layer, resulting in deterioration of image quality due to crosstalk, such as reduction in resolution and color reproducibility, color mixture, and brightness difference.

In the technique disclosed in PTL 1, to address the problem of crosstalk, the polarization units corresponding to adjacent pixels have polarization characteristics for different directions, so that specific polarized light transmitted through one polarization unit and reflected by the metal wiring layer is blocked by another adjacent polarization unit.

However, since the technique disclosed in PTL 1 provides a configuration in which the light transmitted through the polarization unit for one pixel is not reflected toward the original one pixel by the metal wiring layer, there is a problem that the transmitted light becomes useless, failing to efficiently utilize light taken in from the outside.

Since the technique disclosed in PTL 2 provides the concave reflector disposed directly under the pixel, there is a problem that the manufacturing process is complicated and manufacturing variations are likely to occur. In addition, since the reflector, which is concave, requires a sufficient thickness in the depth direction, there is a problem that the thickness is now allowed to be reduced.

Therefore, an object of the technique according to the present disclosure is to provide a backside illumination type solid-state imaging device that prevents deterioration of image quality such as reduction in resolution and color reproducibility, color mixture, and brightness difference.

More specifically, the present technique provides a backside illumination type solid-state imaging device capable of preventing crosstalk of light transmitted through a photoelectric conversion layer and efficiently utilizing light taken in from the outside.

Solution to Problem

The present technique to solve the above problems includes the following specific matters or technical features.

Specifically, the present technique according to a certain aspect is a solid-state imaging device including: a semiconductor support substrate; a wiring layer formed on the semiconductor support substrate and including a predetermined metal wiring pattern; a photoelectric conversion layer provided on the wiring layer and including a plurality of photoelectric conversion elements that are formed in an array to generate charges by photoelectric conversion based on light incident on an incident surface; and a reflective structure disposed corresponding to each of the plurality of photoelectric conversion elements between the predetermined metal wiring pattern and the photoelectric conversion layer, the reflective structure having predetermined electromagnetic characteristics. Among the light incident on the photoelectric conversion layer, the reflective structure condenses and reflects light transmitted through each photoelectric conversion element of the photoelectric conversion layer at and to the photoelectric conversion element.

Further, the present technique according to another aspect may be a method of manufacturing the solid-state imaging device. The method includes forming the reflective structure on the photoelectric conversion layer, the reflective structure including a collection of meta-atoms having a gap surface plasmon (GSP) structure. The forming of the reflective structure includes forming a metal layer included in the GSP structure using damascene technique.

Furthermore, the present technique according to still another aspect may be an electronic device including the solid-state imaging device and a control unit that controls the solid-state imaging device.

The term "unit/part" as used herein not only means simply a physical unit/part but also includes a function of the unit/part to be implemented by software. A function of one unit/part may be implemented by two or more physical units/parts, or functions of two or more units/parts may be implemented by one physical unit/part. The term "system" refers to a logical assembly of multiple devices (or functional modules that implement specific functions), and whether or not each device or functional module is in a single housing does not matter.

Other technical features, purposes, and effects or advantages of the present technique will become apparent through the following embodiments, which will be described with reference to the accompanying drawings. The advantageous effects described herein are merely exemplary and are not limited, and other advantageous effects may be obtained.

DESCRIPTION OF EMBODIMENTS

Embodiments of the present invention will be described below with reference to the drawings. However, the embodiments described below are merely examples, and are not intended to exclude various modifications and technical applications not explicitly described below. The present invention can be implemented in various modifications (for example, any combination of the embodiments) without departing from the spirit and scope of the invention. In the following description of the drawings, the same or similar portions are denoted with the same or similar reference signs. Also, the drawings are schematically illustrated and do not necessarily coincide with actual dimensions, ratios, and the like. In addition, the drawings include portions where dimensional relationships and ratios differ between the drawings in some cases. Note that the present disclosure describes the following separate embodiments.

Figure 1:
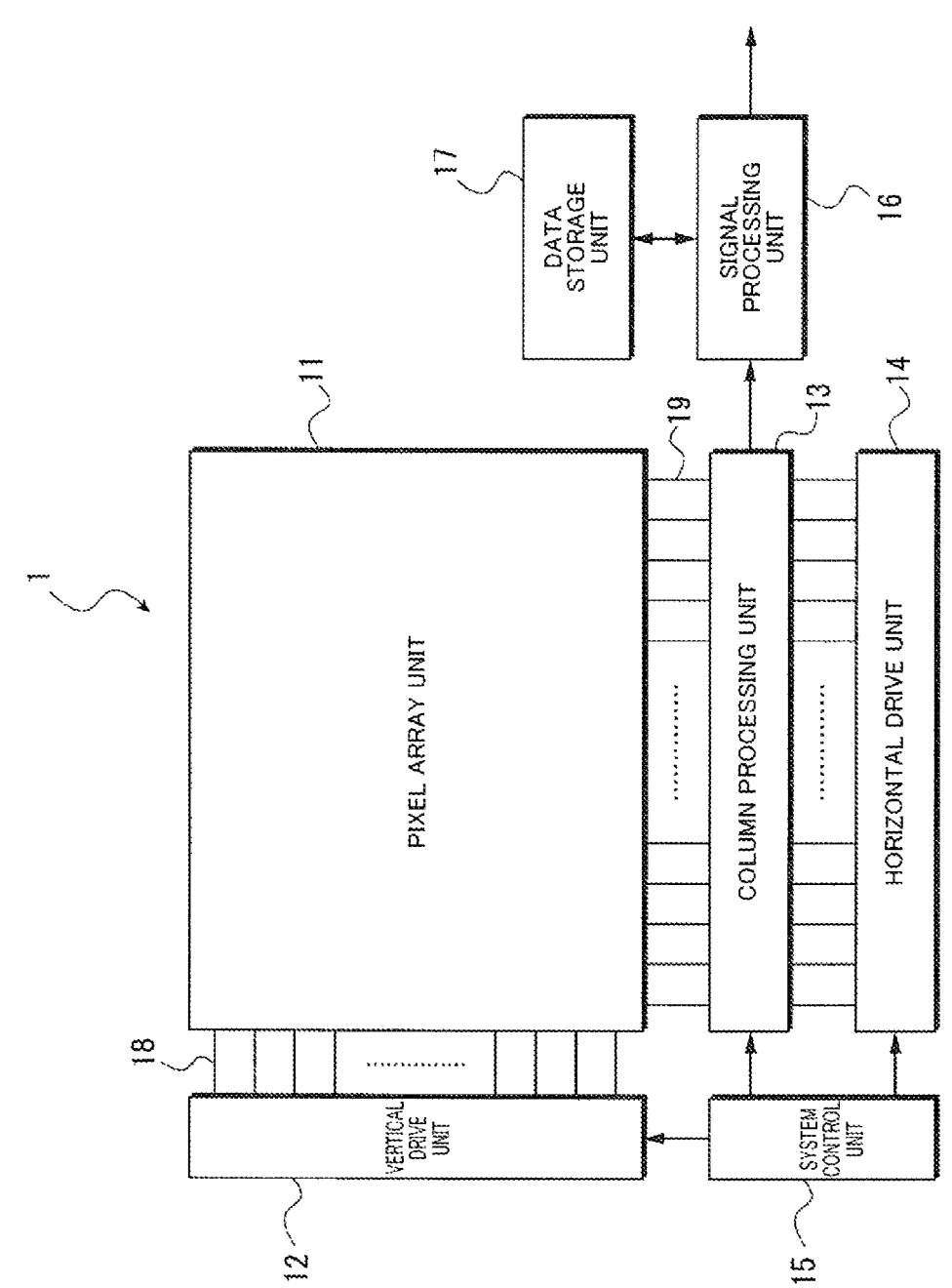
FIG. 1 is a block diagram illustrating an example of a schematic configuration of a solid-state imaging device according to an embodiment of the present technique.

1. First Embodiment: Backside Illumination Type Solid-State Imaging Device with Reflective Structure
2. Second Embodiment: Arrangement of Reflective Structure in consideration of Pixel Position within Angle of View
3. Third Embodiment: Reflective structure in consideration of Electromagnetic Interference with Metal Wiring Pattern 1. First Embodiment FIG. 1 is a block diagram illustrating an example of a schematic configuration of a solid-state imaging device according to an embodiment of the present technique. The solid-state imaging device 1 is a semiconductor device that uses photoelectric conversion elements, such as photodiodes, corresponding to pixels to convert the amounts of charges corresponding to the intensities of light focused on the pixels into electric signals. The solid-state imaging device 1 is configured as, for example, a CMOS image sensor. The solid-state imaging device 1 may be configured integrally as, for example, a system-on-chip (SoC) such as a CMOS LSI, or some components described below, for example, may be configured as separate LSIs. In the present disclosure, the solid-state imaging device 1 is exemplified as a so-called backside illumination type solid-state imaging device. In the backside illumination type solid-state imaging device, a surface of the semiconductor substrate on which light from the outside is incident is called the "back surface", and the opposite side is called the "front surface".

As illustrated in FIG. 1, the solid-state imaging device 1 includes various components including, for example, a pixel array unit 11, a vertical drive unit 12, a column processing unit 13, a horizontal drive unit 14, a system control unit 15, a signal processing unit 16, and a data storage unit 17.

The pixel array unit 11 includes pixels arranged in an array in the horizontal direction (row direction) and the vertical direction (column direction). A region in which the pixels are arranged in an array defines a so-called "angle of view" corresponding to a space whose image is to be captured. Each pixel typically is composed of a pixel circuit including a photoelectric conversion element such as a photodiode and electronic elements such as various transistors. The pixel array unit 11 converts the amount of charge corresponding to the intensity of incident light focused on each pixel into an electric signal, and outputs the electric signal as a pixel signal. Note that optical elements such as a micro on-chip lens and a color filter for condensing incident light are formed on each pixel of the pixel array unit 11, as will be described later.

The vertical drive unit 12 is configured with a shift register, an address decoder, and the like. The vertical drive unit 12 supplies drive signals and the like to the pixels through a plurality of pixel drive lines 18 to drive the pixels of the pixel array unit 11, for example, simultaneously or for each row.

The column processing unit 13 reads pixel signals from the pixels through a vertical signal line 19 for each pixel column of the pixel array unit 11, and performs noise removal processing, correlated double sampling (CDS) processing, and analog-to-digital (A/D) conversion processing, and the like. The image signals processed by the column processing unit 13 are output as image data to the signal processing unit 16.

The horizontal drive unit 14 is configured with a shift register, an address decoder, and the like. The horizontal drive unit 14 sequentially selects pixels corresponding to the pixel columns of the column processing unit 13. The pixel signals subjected to the signal processing on a pixel basis by the column processing unit 13 are sequentially output to the signal processing unit 16 by the selective scanning of the horizontal drive unit 14.

The system control unit 15 is configured with a timing generator that generates various timing signals, and the like. The system control unit 15 controls the driving of the vertical drive unit 12, the column processing unit 13, and the horizontal drive unit 14 based on the various timing signals generated by the timing generator.

The signal processing unit 16 performs signal processing such as arithmetic processing on the pixel data supplied from the column processing unit 13 while temporarily storing the pixel data in the data storage unit 17 as required, and outputs an image signal based on each pixel signal.

Note that the solid-state imaging device 1 to which the present technique is applied is not limited to the configuration described above. For example, in the solid-state imaging device 1, the data storage unit 17 may be disposed at the next stage of the column processing unit 13 so that the pixel signals output from the column processing unit 13 are supplied to the signal processing unit 16 via the data storage unit 17. Alternatively, in the solid-state imaging device 1, the column processing unit 13, the data storage unit 17, and the signal processing unit 16, which are connected in series, may be configured to process the pixel signals in parallel.

Figure 2:
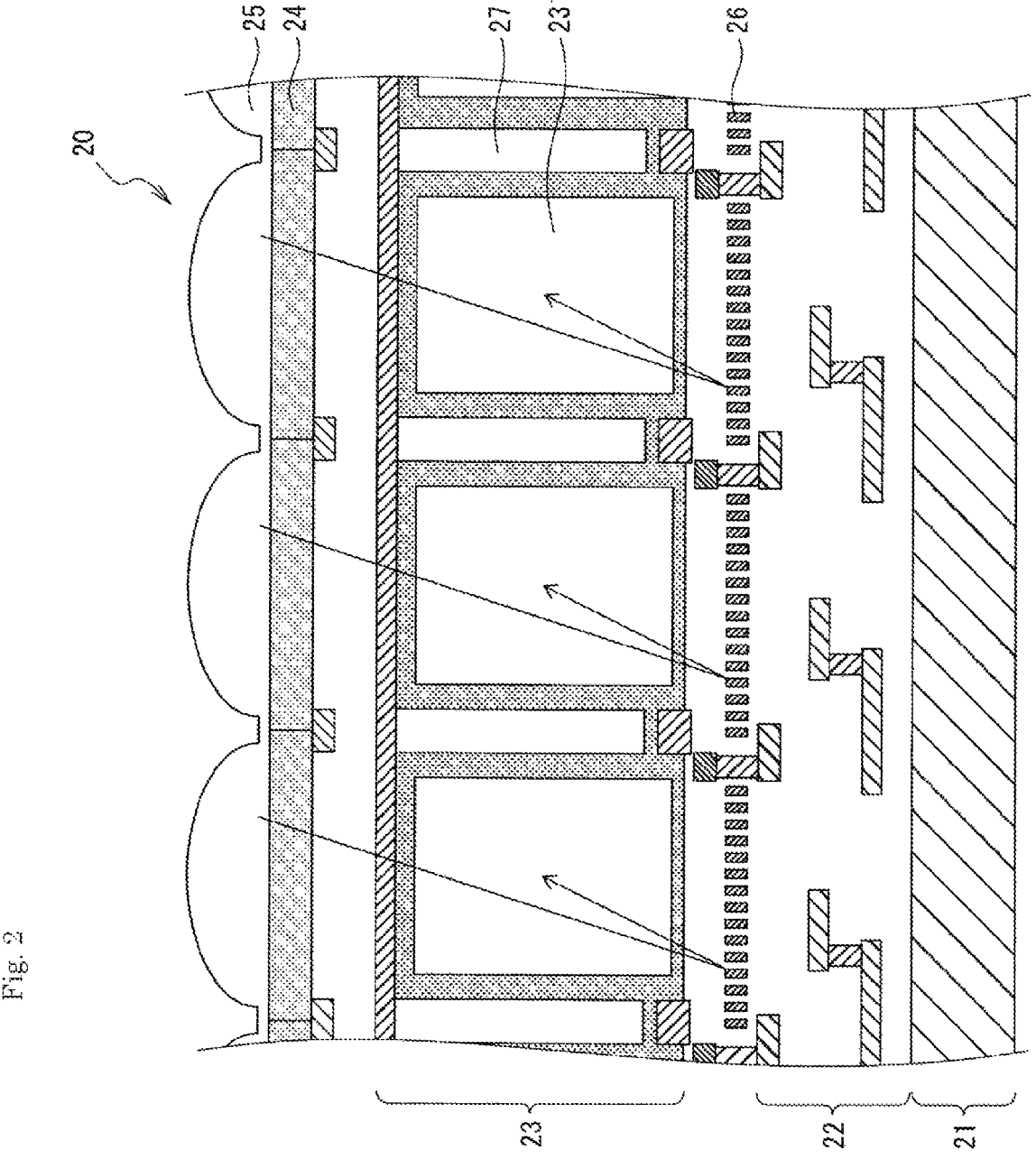
FIG. 2 is a partial vertical cross-sectional view illustrating an example of a semiconductor structure of the solid-state imaging device according to the embodiment of the present technique.

FIG. 2 is a partial vertical cross-sectional view illustrating an example of a semiconductor structure of the solid-state imaging device according to the embodiment of the present technique. As illustrated in FIG. 2, the semiconductor structure 20 generally includes, for example, a semiconductor support substrate 21, a wiring layer 22, a photoelectric conversion layer 23, a color filter 24, and an on-chip lens 25. The semiconductor structure 20 of the present disclosure also includes a reflective structure 26. To form such a semiconductor structure 20, for example, a first silicon substrate including the wiring layer 22 and various logic circuits (not illustrated) may be integrally bonded to a second silicon substrate including the photoelectric conversion layer 23.

The on-chip lens 25 is an optical lens for efficiently condensing light incident on the solid-state imaging device 1 from the outside to form an image on each pixel (that is, a photoelectric conversion element 231) in the photoelectric conversion layer 23. The on-chip lens 25 is typically disposed for each pixel. Further, in the present disclosure, the on-chip lenses 25 are arranged for so-called pupil correction in order to effectively utilize light in a peripheral region of the angle of view of the solid-state imaging device 1. Specifically, on-chip lenses 25 corresponding to pixels located in a central region of the angle of view (zero image height) are arranged so that their optical axis substantially coincides with the center of the corresponding pixel, while on-chip lenses 25 located closer to the peripheral region of the angle of view (higher image height) are arranged with a larger offset from the center of the corresponding pixel. In other words, the position of the on-chip lens 25 is offset closer to the emission direction of the main light beam as it is closer to the peripheral region of the angle of view. The on-chip lenses 25 for the corner regions of the angle of view are each offset from the center of the corresponding pixel in both the vertical and horizontal directions. Such pupil correction makes it possible to utilize main light beam obliquely incident in the peripheral region of the angle of view. In addition, such pupil correction makes it possible to effectively reflect light by the reflective structure 26, which will be described later, and to more effectively suppress the occurrence of crosstalk. Note that the on-chip lens 25 is made of, for example, silicon oxide, silicon nitride, silicon oxynitride, organic SOG, polyimide resin, fluorine resin, or the like.

The color filter 24 is an optical filter that selectively transmits light with a predetermined wavelength among the light condensed by the on-chip lens 25. In this example, four color filters 24 are used that selectively transmit the wavelengths of, but not limited to, red light, green light, blue light, and near-infrared light. A color filter 24 corresponding to one of the colors (wavelengths) is disposed for each pixel.

The photoelectric conversion layer 23 is a functional layer in which pixel circuits are formed that each include the photoelectric conversion element 231 such as a photodiode corresponding to a pixel and electronic elements such as various transistors. Each photoelectric conversion element 231 in the photoelectric conversion layer 23 generates an amount of charge corresponding to the intensity of light incident through the on-chip lens 25 and the color filter 24, converts the amount of charge into an electric signal, and outputs the electric signal as a pixel signal. Note that part of the light (for example, near-infrared light) incident on the incident surface of the photoelectric conversion layer 23 may pass through the surface (that is, the front surface) opposite to the incident surface (that is, the back surface). The photoelectric conversion layer 23 is produced on a silicon substrate by a semiconductor manufacturing process. The photoelectric conversion element 231 and the various electronic elements are electrically connected to predetermined metal wires in the wiring layer 22. Further, the photoelectric conversion layer 23 may be formed with a pixel separator 27 that separates adjacent pixels. The pixel separator 27 has a trench structure formed by etching, for example. The pixel separator 27 prevents light incident on a pixel from entering an adjacent pixel.

The wiring layer 22 is a layer formed with a metal wiring pattern for transmitting electric power and various drive signals to the pixels in the photoelectric conversion layer 23 and for transmitting pixel signals read from the pixels. In this example, the wiring layer 22 is formed on the semiconductor support substrate 21. The wiring layer 22 may have a configuration in which a plurality of metal wiring pattern layers are laminated with an interlayer insulating film interposed therebetween. Moreover, the laminated metal wiring patterns are electrically connected by vias, for example, as required. The wiring layer 22 is made of metal such as aluminum (Al) or copper (Cu), for example. On the other hand, the interlayer insulating film is formed of silicon oxide or the like, for example.

The semiconductor support substrate 21 is a substrate for supporting various layers formed by a semiconductor manufacturing process. Also, on the semiconductor support substrate 21, for example, a logic circuit in some of the various components described above are implemented is formed. The semiconductor support substrate 21 is made of single crystal silicon, for example.

The reflective structure 26 is a structure having a property of reflecting light transmitted through the photoelectric conversion element 231 in the photoelectric conversion layer 23 toward the photoelectric conversion element 231. As an example, the reflective structure 26 is configured to control the direction of reflection so that the reflected light is condensed at a substantially central portion of the photoelectric conversion element 231. In the present disclosure, the reflective structure 26 is formed between the photoelectric conversion layer 23 and the wiring layer 22. Such a configuration prevents light (for example, near-infrared light) transmitted through the photoelectric conversion element 231 from being reflected by the metal wiring pattern in the wiring layer 22 and then entering the adjacent photoelectric conversion elements 231.

Figure 3:
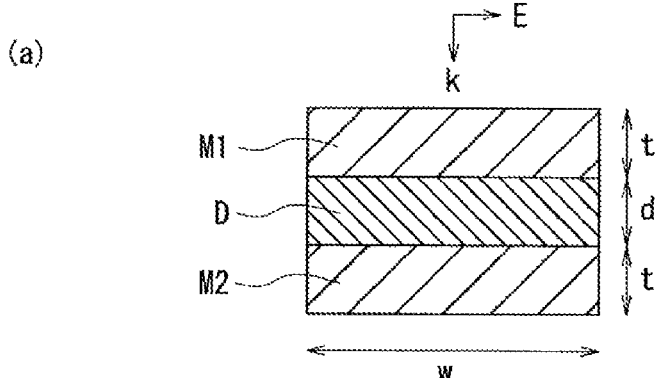
FIG. 3 illustrates examples of meta-atoms of a reflective structure in the solid-state imaging device according to the embodiment of the present technique.
Figure 3:
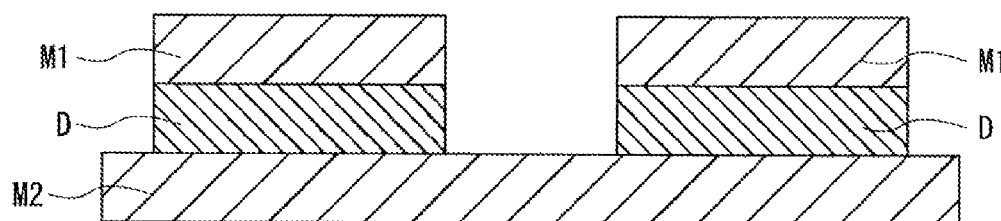
Figure 3:
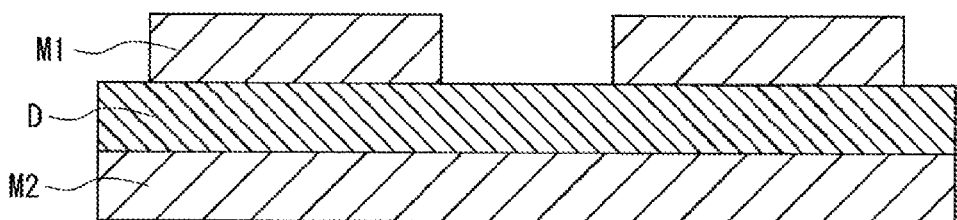

The reflective structure 26 of the present disclosure is a structure as a "metamaterial" (metamaterial structure (sometimes referred to as "metasurface") with the concept of improving electromagnetic properties (optical properties) by increased capacitance and inductance. If the effective permittivity and permeability of the metamaterial are each controlled to make their values negative, it is possible to make the effective refractive index negative (that is, reflective). Such a metamaterial structure typically is composed of a collection of unit structures called "meta-atoms". As illustrated in FIG. 3, for example, in the reflective structure 26, each meta-atom has, but not limited to, a gap surface plasmon (GSP) structure.

In the solid-state imaging device 1 configured as described above, the light incident on the incident surface of each pixel from the outside is condensed by the on-chip lens 25, and the light with a predetermined wavelength corresponding to the same pixel, among others, is selectively transmitted through the color filter 24, and then reaches the photoelectric conversion layer 23. The photoelectric conversion element 231 in the photoelectric conversion layer 23 generates charges corresponding to the intensity of the incident light, and outputs the charges as a pixel signal. Part of the light (for example, near-infrared light) that has reached and entered the photoelectric conversion layer 23 is then transmitted through the photoelectric conversion layer 23, but is reflected by the reflective structure 26 and travels as reflected light toward a substantially central portion of the photoelectric conversion element 231. In this way, the light transmitted through the photoelectric conversion layer 23 is reflected by the wiring layer 22 and does not enter the adjacent photoelectric conversion elements 231, thereby making it possible to prevent the occurrence of crosstalk. Further, the reflection directivity of the light transmitted through the photoelectric conversion layer 23 is controlled by the reflective structure 26, and the light is condensed by the photoelectric conversion element 231 for reuse, thereby enabling efficient photoelectric conversion.

FIG. 3 illustrates examples of meta-atoms of the reflective structure in the solid-state imaging device according to the embodiment of the present technique. Specifically, in FIG. 3, (a) to (c) schematically illustrate meta-atoms having the reflective structure 26.

As illustrated in (a) of FIG. 3, the reflective structure 26 of this example has a gap surface plasmon (GSP) structure. The GSP structure is a sandwich structure in which a dielectric D is sandwiched between metals M1 and M2, which are low resistance materials. Such a GSP structure is sometimes referred to as a GSP resonator.

Examples of the metals M1 and M2 may include any one of gold (Au), silver (Ag), copper (Cu), and aluminum (Al), or an alloy containing at least one of them. Further, as considering near-infrared light that is easily transmitted through the photoelectric conversion layer 23 containing silicon (Si) as a main material, a material having a small imaginary part of the complex dielectric constant in the near-infrared region is selected. The metal materials listed above are known to satisfy this condition.

Examples of the dielectric D include single crystal silicon (c-Si), amorphous silicon (a-Si), and germanium (Ge). Similarly, as considering near-infrared light that is easily transmitted through the photoelectric conversion layer 23, a material having a refractive index of more than 3 for light in the near-infrared region is selected. The dielectric materials listed above are known to satisfy this condition.

The resonance wavelength for light perpendicularly entering the GSP structure as illustrated in (a) of FIG. 3 follows an equation for a simple Fabry-Perot resonator given below.

[Math. 1]

$$W \frac{2\pi}{\lambda_0} n_{gsp} = m\pi - \varphi \qquad \text{(Equation 1)}$$

where w is the device width, $\lambda_0$ is the wavelength of the incident light, $n_{gsp}$ is the refractive index of the dielectric, m is the resonance order, and $\varphi$ is the phase delay amount of the reflected light.

Accordingly, the GSP structure is designed so that when light with a resonance wavelength following Equation (1) enters the GSP structure, the effective permeability becomes negative due to a resonant response phenomenon.

In another example of the GSP structure, meta-atoms may share the metal M2 on the lower layer side, as illustrated in (b) of FIG. 3. For example, such a metal M2 on the lower layer side may be formed as a so-called "solid" layer that is not patterned by a semiconductor manufacturing process.

Alternatively, meta-atoms may share the metal M2 and the dielectric D on the lower layer side, as illustrated in (c) of FIG. 3. Similarly, such a dielectric D may be formed as a so-called "solid" layer that is not patterned by a semiconductor manufacturing process. The GSP structure as illustrated in (c) of FIG. 3 is known in which sufficient primary reflected light can be observed.

Note that the reflective structure 26 may be configured as an appropriate combination of at least two of the meta-atoms illustrated in (a) to (c) of FIG. 3.

Further, as described above, the reflective structure 26 is configured to control the reflection directivity so that the reflected light is condensed at a substantially central portion of the source photoelectric conversion element 231. For example, a parabolic phase profile φ of a Fresnel lens that condenses reflected light in the x-y plane is given by the following equation.

[Math. 2]

$$\phi(x, y) = \frac{2\pi}{\lambda_0}\left(\sqrt{x^2 + y^2 + f^2} - f\right) \qquad \text{(Equation 2)}$$

where $\lambda_0$ is the wavelength of the incident light, and f is the focal length.

An interval $\Delta\phi$ between adjacent meta-atoms for a one-dimensional Fresnel lens is expressed by the following equation.

[Math. 3]

$$\Delta\phi = \phi_{i+1} - \phi_i = \frac{2\pi}{N} \qquad \text{(Equation 3)}$$

where N is the number of steps of the one-dimensional Fresnel lens.

As described above, the reflective structure 26 is designed to have a GSP structure with the parabolic phase profile φ given by Equation (2) and the interval $\Delta\phi$ given by Equation (3) in consideration of the reflection directivity.

Figure 4:
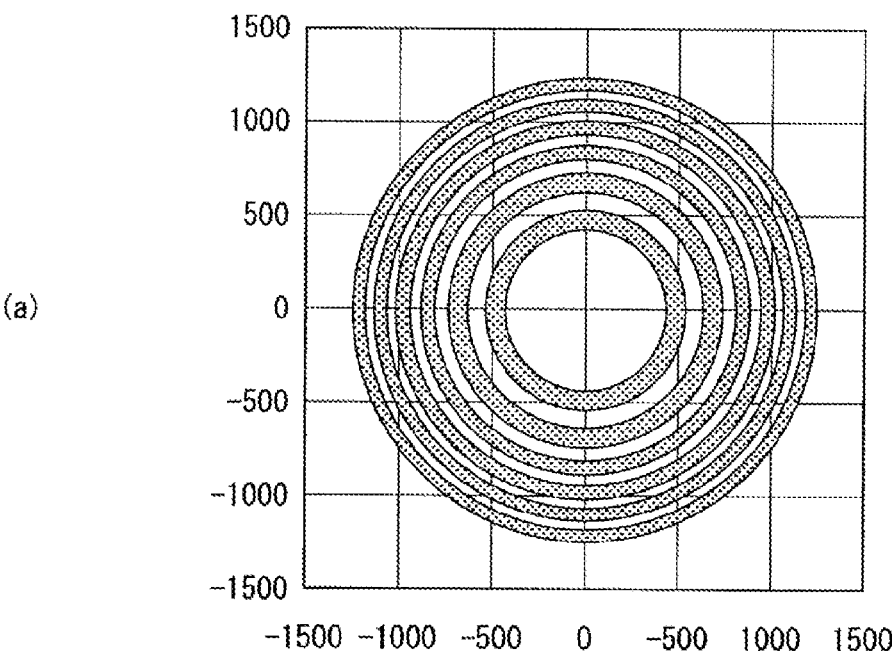
FIG. 4 illustrates an example of the reflective structure in the solid-state imaging device according to the embodiment of the present technique.
Figure 4:
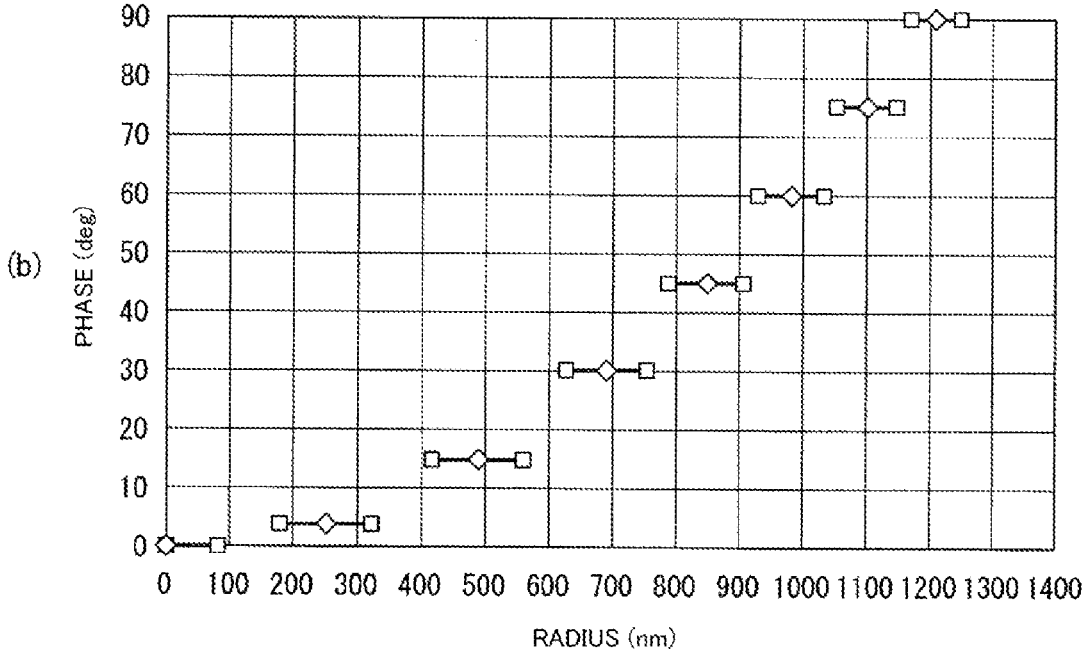

In FIG. 4, (a) illustrates an example of a concentric circular reflective structure 26 that fits in one pixel with a size of 3×3 μm. Specifically, the reflective structure 26 illustrated in (a) of FIG. 4 is designed for incident light with a wavelength λ of 940 nm to have a refractive index $n_{gsp}$ of 3 of the dielectric D, a focus distance f of 3 μm, and a phase profile φ varying by 15° outward from the center in the radial direction (see (b) of FIG. 4) in each meta-atom. Such concentric geometric pattern profile shape is sometimes referred to as bullseye target shape.

The condensing effect (reflection directivity) of such a reflective structure 26 is estimated as follows. Initially, consider the intensity of light (beam) in a direction inclined at an angle θ with respect to the vertical direction of the reflective structure 26 as illustrated in (a) of FIG. 5. The condensing ability of a Fresnel lens is basically calculated by phase calculation based on Huischen's principle. According to wave optics, which requires consideration of waves, a directivity function R(θ) of a disk light source is given by the following equation.

[Math. 4]

$$R(\theta) = \frac{2J_1(ka\sin\theta)}{ka\sin\theta} \qquad \text{(Equation 4)}$$

where θ is the directivity angle from the disk center, k is the wavenumber (2π/λ), a is the disk radius, and $J_1(x)$ is a linear Bessel function of the first kind.

The directivity function R(θ) of the disk light source is expressed by the following equation.

[Math. 5]

$$R(\theta) = \frac{2}{a^2 - b^2}\left\{a^2\frac{J_1(ka\sin\theta)}{ka\sin\theta} - b^2\frac{J_1(kb\sin\theta)}{kb\sin\theta}\right\} \qquad \text{(Equation 5)}$$

where θ is the directivity angle from the disk center, k is the wavenumber (2π/λ), a is the outer radius of the ring, b is the inner radius, and $J_1(x)$ is a linear Bessel function of the first kind.

Figure 5:
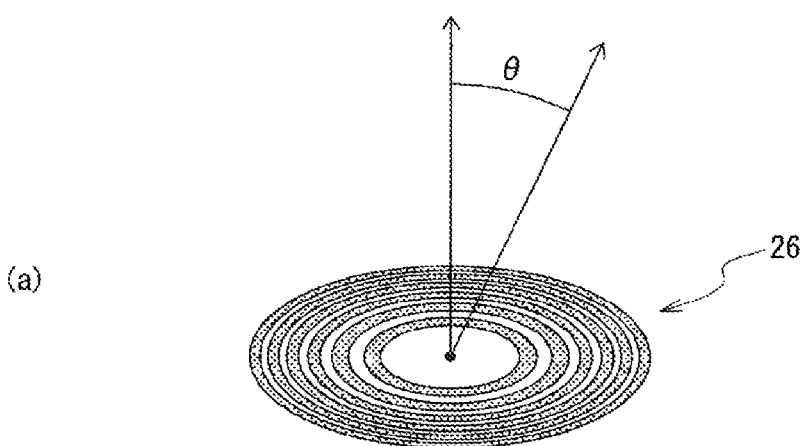
FIG. 5 illustrates an example of light condensing of the reflective structure in the solid-state imaging device according to the embodiment of the present technique.
Figure 5:
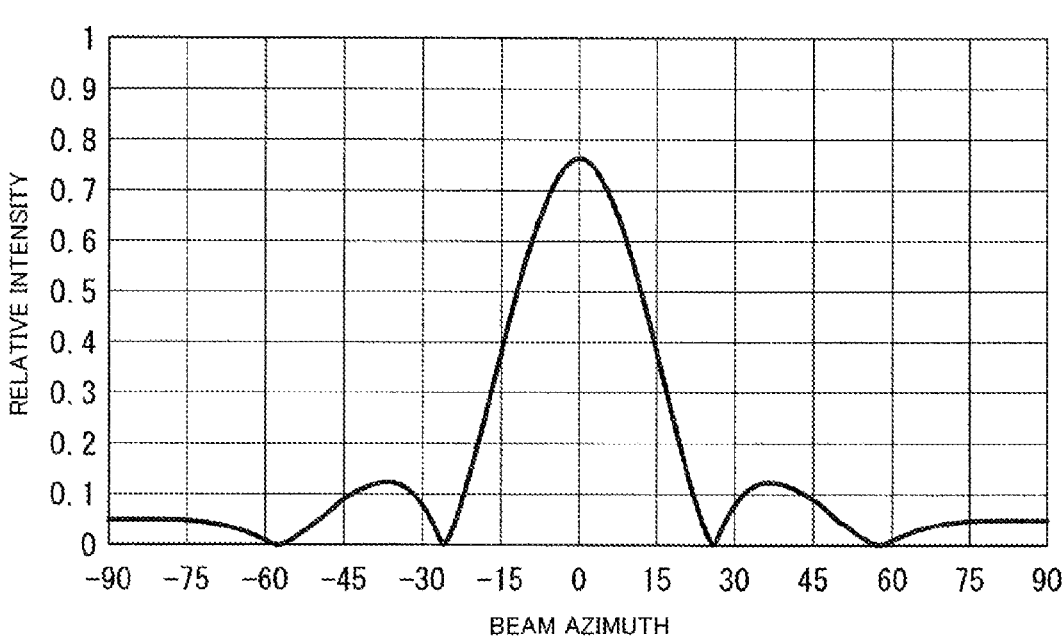

According to Equation (5), the beam profile of the reflective structure 26 as illustrated in (a) of FIG. 4 is obtained as represented in (b) of FIG. 5. As illustrated in (b) of FIG. 5, the condensing effect of the reflective structure 26 according to the present embodiment can be observed in which 70% or more of the incident light is reflected in the vertical direction, while the beam intensity at θ of 30° or more is reduced to 10% or less.

Variations of Reflective Structure 26

Figure 6:
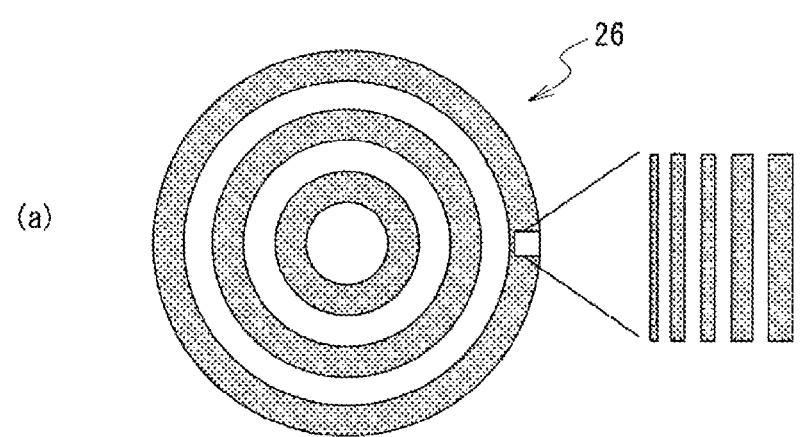
FIG. 6 illustrates an example of a configuration of the reflective structure in the solid-state imaging device according to the embodiment of the present technique.
Figure 6:
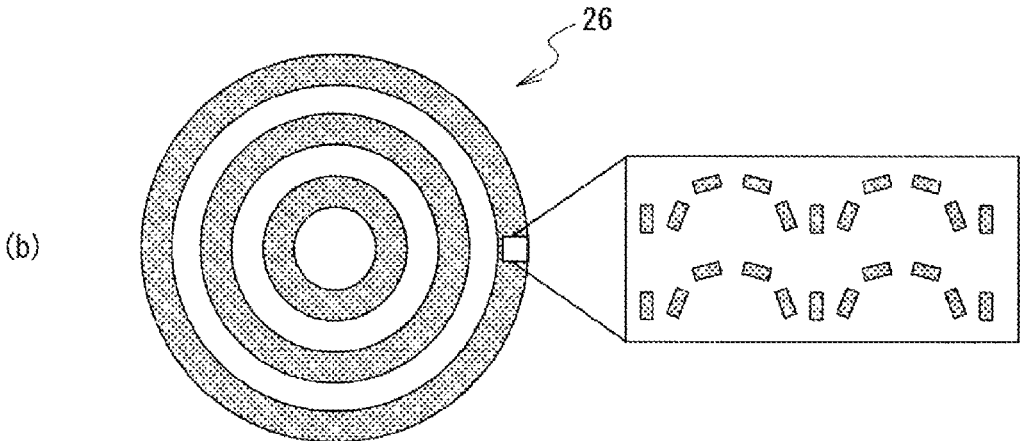
Figure 6:
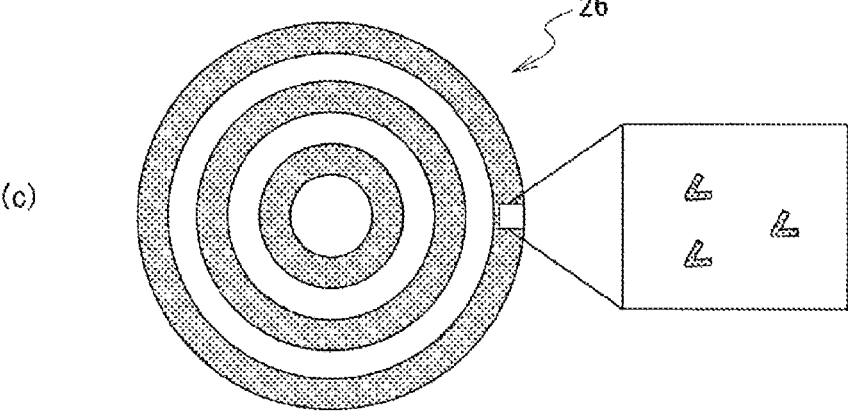

The reflective structure 26 of the present disclosure can employ various meta-atom structures (for example, GSP structures) that are more effective in controlling the phase profile, as illustrated in (a) to (c) of FIG. 6. Specifically, the reflective structure 26 illustrated in (a) of FIG. 6 has annular portions each including a collection of striped meta-atoms. The width of the striped portion may be set as appropriate. The reflective structure 26 illustrated in (b) of FIG. 6 has annular portions each including a collection of bar meta-atoms. The length in the longitudinal direction of the bar portion and/or the length in the transverse direction (width direction) orthogonal thereto and the arrangement layout may be set as appropriate. The reflective structure 26 illustrated in (c) of FIG. 6 has annular portions each including a collection of v-antenna meta-atoms. The angle of the V-antenna (V-shaped angle) and the arrangement layout can be set as appropriate.

Figure 7:
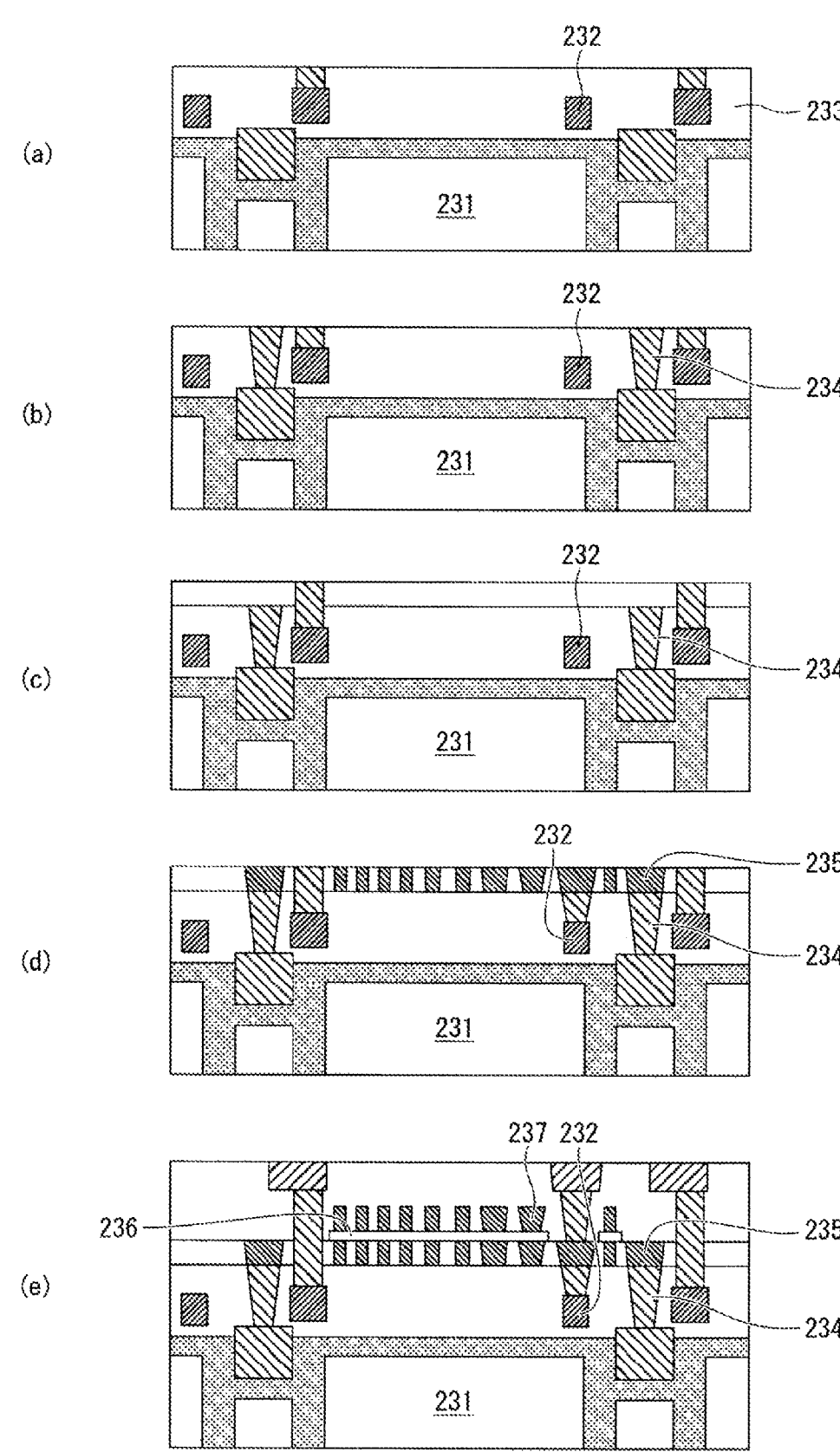
FIG. 7 illustrates an example of a process of manufacturing the solid-state imaging device according to the embodiment of the present technique.

FIG. 7 illustrates an example of a process of manufacturing a solid-state imaging device according to an embodiment of the present technique. Specifically, FIG. 7 illustrates a process of producing the reflective structure 26 on the second silicon substrate (see FIG. 2) on which the photoelectric conversion layer 23 is formed (in FIG. 7, the second silicon substrate illustrated in FIG. 2 is illustrated upside down). The photodiodes, the transistors (for example, NMOS transistors), and the like, which are included in the pixel circuits in the photoelectric conversion layer 23 on the second silicon substrate, are formed, for example, in a known front end of line (FEOL) manufacturing process for semiconductors.

First, in (a) of FIG. 7, the photoelectric conversion layer 23 including the photoelectric conversion element 231 separated by the pixel separators 27 is illustrated. Gate electrodes 232 are formed on the photoelectric conversion layer 23, and a silicon oxide insulating film 233 is further formed.

Next, as illustrated in (b) of FIG. 7, contact plug structures 234 are formed on the pixel separators 27. Each contact plug structure 234 is filled with tungsten, for example. The contact plug structures 234 prevent light (transmitted light) from entering adjacent pixels.

Next, as illustrated in (c) of FIG. 7, a silicon oxide insulating film 233 is further deposited, and then, as illustrated in (d) of FIG. 7, a first metal layer 235 included in the GSP is formed, for example, using damascene technique. The damascene technique is a technique of forming a trench in portions in an insulating film where metal is to be formed and filling the trench with metal. Excess metal formed on portions other than the trench is removed, for example, by chemical mechanical polishing (CMP). In the present disclosure, as the metal material of the first metal layer 235, any one of gold (Au), silver (Ag), copper (Cu), and aluminum (Al), or an alloy containing at least one of them is selected.

Next, as illustrated in (e) of FIG. 7, a dielectric layer 236 is formed, and similarly, a second metal layer 237 is then formed, for example, using damascene technique. Further, in this example, a space (via) for electrical connection to each gate electrode 232 is reserved directly above the gate electrode 232 (see a third embodiment). In other words, the GSP structure is not formed directly above the gate electrode 232. In the partial cross-sectional view of (e) of FIG. 7, an electrical connection structure is illustrated for the gate electrode 232 on the right side.

As described above, the reflective structure 26 having the GSP structure is formed on the second silicon substrate. Note that the second silicon substrate in which the reflective structure 26 is formed on the photoelectric conversion layer 23 is integrally bonded to the first silicon substrate in which the wiring layer 22 and the logic circuits are formed to form a semiconductor structure (see FIG. 2).

As described above, according to the present embodiment, since the metamaterial reflective structure 26 is provided between the photoelectric conversion layer 23 and the wiring layer 22, the light transmitted through the photoelectric conversion element 231 in the photoelectric conversion layer 23 is reflected toward the photoelectric conversion element 231 by the reflective structure 26, thereby making it possible to prevent the occurrence of crosstalk due to light entering adjacent pixels. In addition, since the reflective structure 26 reflects light toward a substantially central portion of the photoelectric conversion element 231 so as to condense the light, the light transmitted through the photoelectric conversion layer 23 can be reused, thereby enabling efficient photoelectric conversion.

Furthermore, since the reflective structure 26 is made from a metamaterial, the reflective structure 26 does not require a large thickness in the depth direction unlike a concave shape, which contributes to making the solid-state imaging device 1 thinner. Furthermore, since the reflective structure 26 can be formed by, for example, damascene technique in a semiconductor manufacturing process, it can be manufactured with very high precision, and the occurrence of manufacturing variations can be suppressed.

2. Second Embodiment

The present embodiment is a modification of the above-described embodiment, and is characterized by adjusting the position of the reflective structure in consideration of the pupil correction of the on-chip lenses.

Specifically, as described above, on-chip lenses 25 corresponding to pixels located in a central region of the angle of view are arranged so that their optical axis substantially coincides with the center of the corresponding pixel, while on-chip lenses 25 located closer to a peripheral region of the angle of view are arranged with a larger offset from the center of the corresponding pixel. According to the amount of offset of the on-chip lens 25 for such pupil correction, the reflective structure 26 is disposed with an offset depending on the direction of the main light beam to enter.

Figure 8:
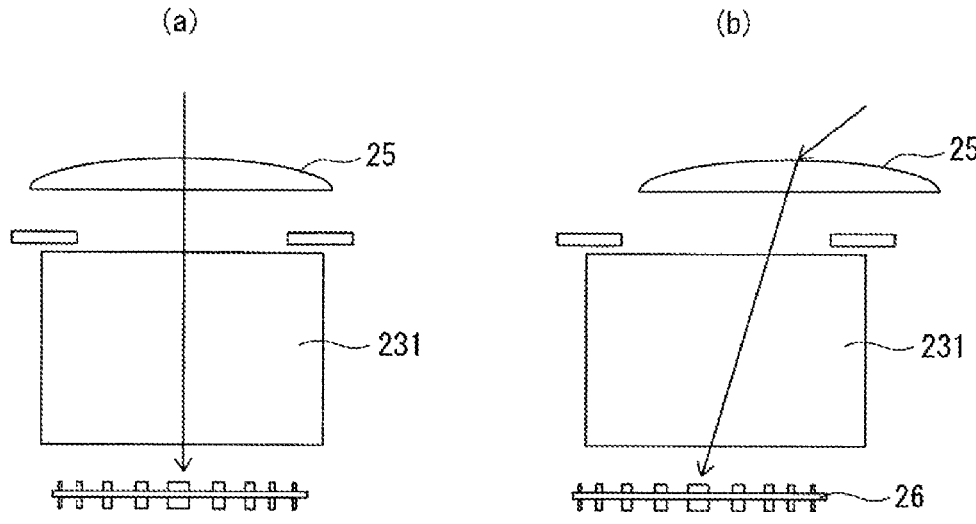
FIG. 8 illustrates examples of arrangements of the reflective structure for pupil correction in the solid-state imaging device according to the embodiment of the present technique.

FIG. 8 illustrates examples of arrangements of the reflective structure for pupil correction in the solid-state imaging device according to the embodiment of the present technique.

Specifically, in FIG. 8, (a) illustrates a positional relationship between an on-chip lens 25 and a reflective structure 26 corresponding to a pixel located in the central region of the angle of view. As illustrated in (a) of FIG. 8, since the on-chip lens 25 corresponding to the pixel located in the central region of the angle of view is disposed so that its optical axis coincides with the center of the pixel, the reflective structure 26 is also disposed to coincide with the center of the pixel accordingly.

In FIG. 8, (b) illustrates a positional relationship between an on-chip lens 25 and a reflective structure 26 corresponding to a pixel located in the peripheral region of the angle of view. As illustrated in (b) of FIG. 8, since the on-chip lens 25 corresponding to the pixel located in the peripheral region of the angle of view (in this example, on the left end side of the central region of the angle of view in plan view) guides the main light beam obliquely toward the center of the pixel, the reflective structure 26 is disposed with an offset in its extending direction, that is, at its point-symmetrical position. In other words, the reflective structure 26 is disposed with an offset in the opposite direction with respect to the center of the photoelectric conversion element 231 depending on the position of the on-chip lens 25 for the corresponding photoelectric conversion element 231.

Next, an amount of offset of the reflective structure 26 will be described in consideration of the amount of offset of the on-chip lens 25 for pupil correction.

Figure 9:
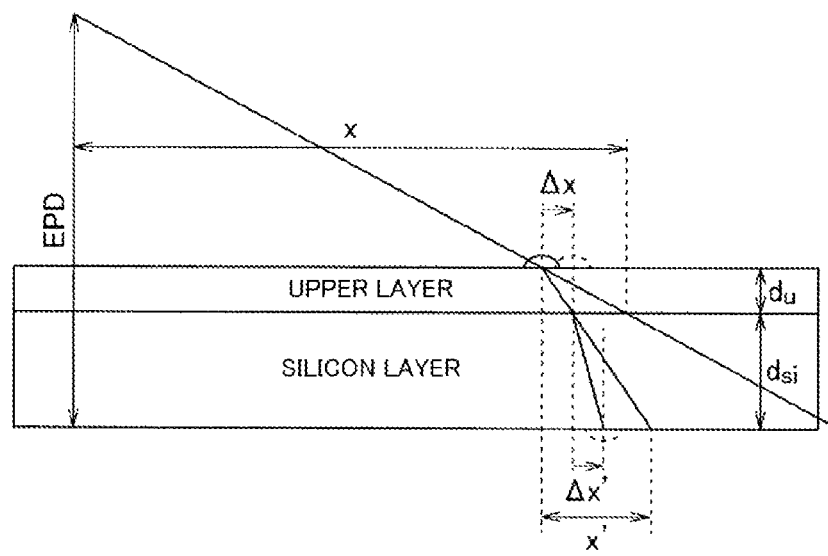
FIG. 9 illustrates part of a pixel of the solid-state imaging device according to the embodiment of the present technique.

FIG. 9 illustrates part of a pixel of the solid-state imaging device according to the embodiment of the present technique. In FIG. 9, an amount of offset $\Delta x$ of an on-chip lens 25 is given by the following equation, where EPD is an emission pupil distance from a virtual light source, $d_u$ is the thickness of the upper layer on the photoelectric conversion element 231 (in this example, the distance from the silicon layer to the on-chip lens), $d_{Si}$ is the thickness of the silicon layer on the photoelectric conversion element 231, x is the distance from zero image height to the center of the pixel, $n_a$ is the refractive index of air ($n_a$=1), and $n_u$ is the refractive index of the upper layer.

$$\Delta x = x^* (d_u/EPD) \times (n_a/n_u) \qquad \text{(Equation 6)}$$

Similarly, the distance from the pupil correction position to the reflective structure 26, $\Delta x'$ is given by the following equation.

$$\Delta x' = x' \times (d_{Si}/EPD') \times (n_u/n_{Si}) \qquad \text{(Equation 7)}$$

Then, from $x' = \Delta x \times (d_u + d_{Si})/d_u$ and $EPD' = d_u + d_{Si}$, the following equation is obtained.

$$\Delta x' = \Delta x \times d_{Si}/d_u \times n_u/n_u \qquad \text{(Equation 8)}$$

Thus, from Equation 6 and the refractive index of air ($n_a$=1), the following equation is obtained.

$$\Delta x' = x/EPD \times d_{Si}/n_u \qquad \text{(Equation 9)}$$

From the total pupil correction amount of the reflective structure 26, $\Delta x + \Delta x'$, the following equation is obtained.

$$\Delta x + \Delta x' = x / (EPD \times n_u) \times (d_{Si} + d_u) \qquad \text{(Equation 10)}$$

Accordingly, the reflective structure 26 is disposed with a larger amount of offset between the center of the pixel and the center of the reflective structure 26 as the reflective structure 26 is farther from the central region (image height center) of the angle of view toward the peripheral region of the angle of view. As a result, the reflective structure 26 can effectively condense and reflect the light passing through the on-chip lens 25 that is disposed with an offset for pupil correction.

3. Third Embodiment

The present embodiment is a variation of the above-described embodiment, and is characterized in that the reflective structure 26 has an imperfect geometric pattern profile shape. Specifically, the reflective structure 26 of the present embodiment has a configuration in which a part of the geometric pattern profile shape (for example, bullseye target shape) is missing or fragmented.

Figure 10:
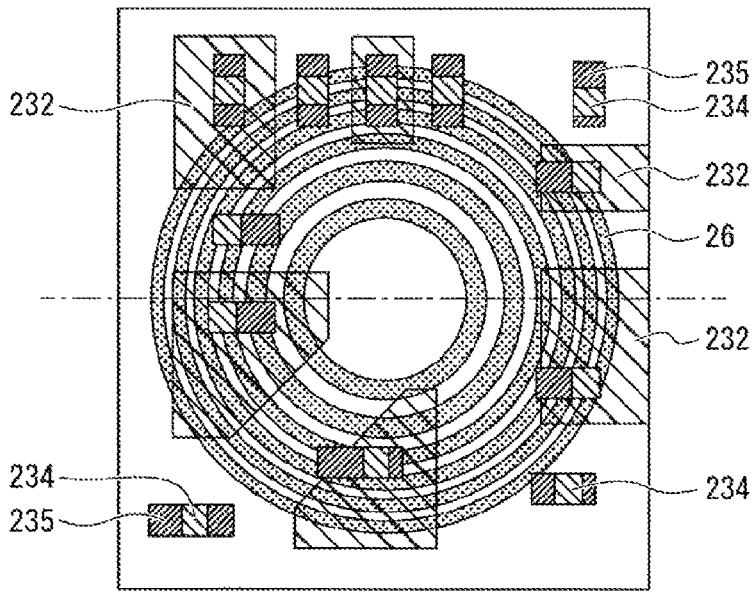
FIG. 10 illustrates a positional relationship between the reflective structure and a metal wiring pattern in the solid-state imaging device according to the embodiment of the present technique.

As illustrated in FIG. 10, in the semiconductor structure 20 of the solid-state imaging device 1, the metal wiring pattern (for example, the gate electrode) of the wiring layer 22 and the reflective structure 26 may be close to each other, causing electromagnetic interference. Especially, for the reflective structure 26 having a size close to the size of a pixel, the effect of electromagnetic interference is increased. Therefore, in the present embodiment, the reflective structure 26 has a configuration in which a part of the geometric pattern profile shape is missing (not formed).

Figure 11:
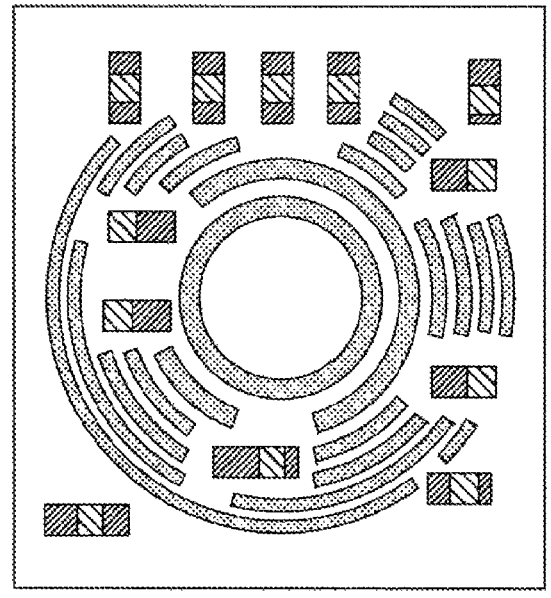
FIG. 11 is a plan cross-sectional view illustrating a profile shape of the reflective structure in the solid-state imaging device according to the embodiment of the present technique.

FIG. 11 is a plan cross-sectional view illustrating a profile shape of the reflective structure in the solid-state imaging device according to the embodiment of the present technique.

As illustrated in FIG. 11, in the reflective structure 26, portions corresponding to the gate electrodes formed in the wiring layer 22 in order to avoid interference have no structure. In other words, the reflective structure 26 forms an imperfect bullseye target shape that is fragmented in places. Thereby, the reflective structure 26 can avoid electromagnetic interference with the metal wiring pattern in the wiring layer 22.

Figure 12:
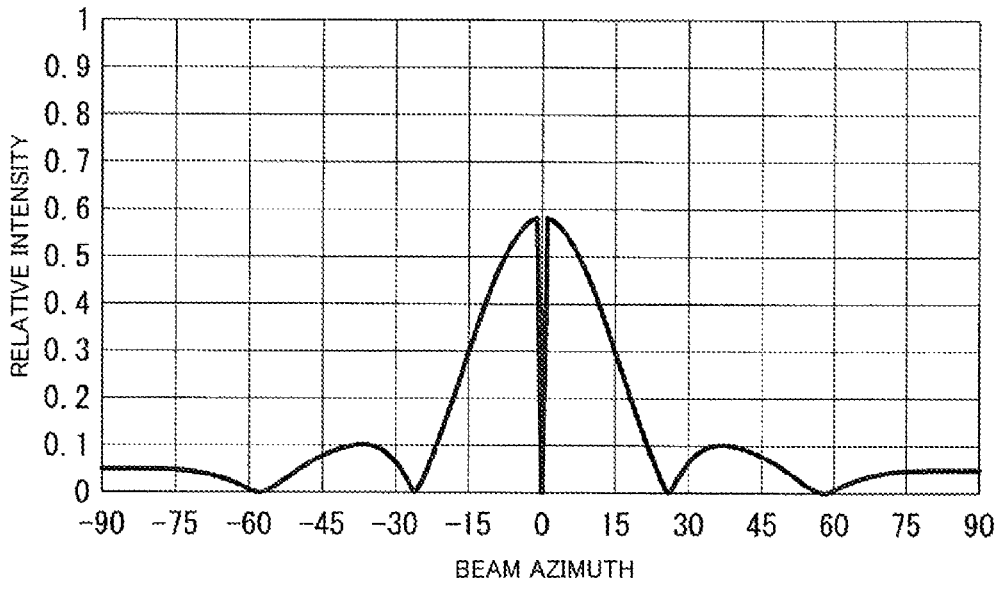
FIG. 12 illustrates an example of a beam profile of the reflective structure in the solid-state imaging device according to the embodiment of the present technique.

FIG. 12 illustrates an example of a beam profile of the reflective structure in the solid-state imaging device according to the embodiment of the present technique. Specifically, FIG. 12 illustrates a beam profile of the reflective structure having the imperfect bullseye target shape illustrated in FIG. 11. As illustrated in FIG. 12, in the reflective structure 26 of the present embodiment, the intensity of the focused light is reduced by about 20% due to the imperfect bullseye target shape (see (b) of FIG. 5), while the reflection directivity still remains. Therefore, the reflection directivity of the light transmitted through the photoelectric conversion layer 23 is controlled by the reflective structure 26, and the light is condensed by the photoelectric conversion element 231 for reuse.

The above-described embodiments are illustrative examples for explaining the present invention, and the present invention is not intended to be limited only to these embodiments. The present invention can be implemented in various forms without departing from the spirit thereof. For example, the steps, the operations, or the functions of the method disclosed in the specification may be performed in parallel or in a different order unless conflicts occur in the result thereof. The described steps, operations, and functions are provided as merely examples, and some of the steps, operations, and functions may be omitted or combined in one step, operation, and functions without departing from the scope and spirit of the invention, and other steps, operations, or functions may be added.

Further, for example, the solid-state imaging device 1 according to the present technique can be applied to an electronic device such as a camera and an image sensor. Such an electronic device may include a control unit that generally controls the operation of the solid-state imaging device 1 and performs various image processing based on image signals output from the signal processing unit 16. The control unit is implemented as, for example, but not limited to, a programmable logic device.

Although various embodiments have been disclosed herein, specific features (technical matters) in one of the embodiments may be added to a different embodiment with appropriate improvements or may be replaced with a specific feature in the different embodiment, and such an embodiment is also included within the spirit of the present invention.

The present technique may be configured to include the following technical matters.

(1)

A solid-state imaging device including:

a semiconductor support substrate;

a wiring layer formed on the semiconductor support substrate and including a predetermined metal wiring pattern;

a photoelectric conversion layer provided on the wiring layer and including a plurality of photoelectric conversion elements that are formed in an array to generate charges by photoelectric conversion based on light incident on an incident surface; and a reflective structure disposed corresponding to each of the plurality of photoelectric conversion elements between the predetermined metal wiring pattern and the photoelectric conversion layer, the reflective structure having predetermined electromagnetic characteristics, wherein among the light incident on the photoelectric conversion layer, the reflective structure condenses and reflects light transmitted through each photoelectric conversion element of the photoelectric conversion layer at and to the photoelectric conversion element.

(2)

The solid-state imaging device according to (1), wherein the reflective structure is a metamaterial structure with a negative effective refractive index.

(3)

The solid-state imaging device according to (2), wherein the reflective structure is configured to condense and reflect light at and to a substantially central portion of the photoelectric conversion element.

(4)

The solid-state imaging device according to (3), wherein the reflective structure is a structure made up of meta-atoms having the predetermined electromagnetic characteristics.

(5)

The solid-state imaging device according to (4), wherein the reflective structure is formed from at least one of a metal material and a dielectric material.

(6)

The solid-state imaging device according to (5), wherein each of the meta-atoms has a gap surface plasmon (GSP) structure.

15           16

(7)

The solid-state imaging device according to (6), wherein the metal material is selected from at least one of Ag, Au, Cu, and Al.

(8)

The solid-state imaging device according to (6), wherein the dielectric material is selected from at least one of Si, Ge, and SiGe.

(9)

The solid-state imaging device according to (4), wherein the reflective structure is configured such that the meta-atoms form a bullseye pattern shape.

(10)

The solid-state imaging device according to (4), wherein the reflective structure is configured such that the meta-atoms form an imperfect bullseye pattern shape.

(11)

The solid-state imaging device according to (10), wherein the imperfect bullseye pattern shape is a shape, part of which is missing to avoid electromagnetic interference with the predetermined metal wiring pattern in the wiring layer.

(12)

The solid-state imaging device according to (1), further comprising a plurality of on-chip lenses provided corresponding to the plurality of photoelectric conversion elements on the incident surface side of the photoelectric conversion layer, wherein each of the plurality of on-chip lenses is disposed with an offset in a predetermined direction from a center of the photoelectric conversion element depending on a position in an angle of view defined by the plurality of photoelectric conversion elements.

(13)

The solid-state imaging device according to (12), wherein the reflective structure is disposed with an offset in a direction opposite to the predetermined direction with respect to the center of the photoelectric conversion element depending on a position of the on-chip lens for the corresponding photoelectric conversion element.

(14)

The solid-state imaging device according to (13), wherein the reflective structure is disposed with a larger amount of offset between a center of the reflective structure and the center of the photoelectric conversion element as the corresponding photoelectric conversion element is farther from a center of the angle of view.

(15)

An electronic device including:

a solid-state imaging device; and a control unit that controls the solid-state imaging device, wherein the solid-state imaging device includes:

a semiconductor support substrate;

a wiring layer formed on the semiconductor support substrate and including a predetermined metal wiring pattern;

a photoelectric conversion layer provided on the wiring layer and including a plurality of photoelectric conversion elements that are formed in an array to generate charges by photoelectric conversion based on light incident on an incident surface; and a reflective structure disposed corresponding to each of the plurality of photoelectric conversion elements between the predetermined metal wiring pattern and the photoelectric conversion layer, the reflective structure having predetermined electromagnetic characteristics, and wherein among the light incident on the photoelectric conversion layer, the reflective structure condenses and reflects light transmitted through each photoelectric conversion element of the photoelectric conversion layer at and to the photoelectric conversion element.

REFERENCE SIGNS LIST

1 Solid-state imaging device
11 Pixel array unit
12 Vertical drive unit
13 Column processing unit
14 Horizontal drive unit
15 System control unit
16 Signal processing unit
17 Data storage unit
18 Pixel drive line
19 Vertical signal line
20 Semiconductor structure
21 Semiconductor support substrate
22 Wiring layer
23 Photoelectric conversion layer
231 Photoelectric conversion element
232 Gate electrode
233 Silicon oxide insulating film
234 Contact plug structure
235 First metal layer
236 Dielectric layer
237 Second metal layer
24 Color filter
25 On-chip lens
26 Reflective structure
27 Pixel separator

What is claimed is:

1. A solid-state imaging device, comprising:

a semiconductor support substrate;

a wiring layer formed on the semiconductor support substrate and including a predetermined metal wiring pattern;

a photoelectric conversion layer provided on the wiring layer and including a plurality of photoelectric conversion elements that are formed in an array to generate charges by photoelectric conversion based on light incident on an incident surface; and a reflective structure disposed corresponding to each of the plurality of photoelectric conversion elements between the predetermined metal wiring pattern and the photoelectric conversion layer, the reflective structure having predetermined electromagnetic characteristics, wherein the reflective structure includes a plurality of elements, wherein a first one of the elements is closer to a centerline of the corresponding photoelectric conversion element than any other of the elements, wherein the first one of the elements is an annular element that encloses an open center area, wherein the first one of the elements is within an area enclosed by a second one of the elements, wherein the first one of the elements is spaced apart from the second one of the elements, and wherein among the light incident on the photoelectric conversion layer, the reflective structure condenses and reflects light transmitted through each photoelectric conversion element of the photoelectric conversion layer at and to the photoelectric conversion element.

2. The solid-state imaging device according to claim 1, wherein the reflective structure is a metamaterial structure with a negative effective refractive index.

3. The solid-state imaging device according to claim 2, wherein the reflective structure is configured to condense and reflect light at and to a substantially central portion of the photoelectric conversion element.

4. The solid-state imaging device according to claim 3, wherein the reflective structure is a collection of meta-atoms.

5. The solid-state imaging device according to claim 4, wherein the reflective structure is formed from a metal material and a dielectric material.

6. The solid-state imaging device according to claim 5, wherein each of the meta-atoms has a gap surface plasmon (GSP) structure.

7. The solid-state imaging device according to claim 6, wherein the metal material is selected from at least one of Ag, Au, Cu, and Al.

8. The solid-state imaging device according to claim 6, wherein the dielectric material is selected from at least one of Si, Ge, and SiGe.

9. The solid-state imaging device according to claim 4, wherein the reflective structure is configured such that the meta-atoms form a bullseye pattern shape.

10. The solid-state imaging device according to claim 4, wherein the reflective structure is configured such that the meta-atoms form an imperfect bullseye pattern shape.

11. The solid-state imaging device according to claim 10, wherein the imperfect bullseye pattern shape is a shape, part of which is missing to avoid electromagnetic interference with the predetermined metal wiring pattern in the wiring layer.

12. The solid-state imaging device according to claim 1, further comprising a plurality of on-chip lenses provided corresponding to the plurality of photoelectric conversion elements on the incident surface side of the photoelectric conversion layer, wherein each of the plurality of on-chip lenses is disposed with an offset in a predetermined direction from a center of the photoelectric conversion element depending on a position in an angle of view defined by the plurality of photoelectric conversion elements.

13. The solid-state imaging device according to claim 12, wherein the reflective structure is disposed with an offset in a direction opposite to the predetermined direction with respect to the center of the photoelectric conversion element depending on a position of an on-chip lens for the corresponding photoelectric conversion element and included in the plurality of on-chip lenses.

14. The solid-state imaging device according to claim 13, wherein the reflective structure is disposed with a larger amount of offset between a center of the reflective structure and the center of the photoelectric conversion element as the corresponding photoelectric conversion element is farther from a center of the angle of view.

15. An electronic device, comprising:

a solid-state imaging device; and a control unit that controls the solid-state imaging device, wherein the solid-state imaging device includes:

a semiconductor support substrate;

a wiring layer formed on the semiconductor support substrate and including a predetermined metal wiring pattern;

a photoelectric conversion layer provided on the wiring layer and including a plurality of photoelectric conversion elements that are formed in an array to generate charges by photoelectric conversion based on light incident on an incident surface; and a reflective structure disposed corresponding to each of the plurality of photoelectric conversion elements between the predetermined metal wiring pattern and the photoelectric conversion layer, the reflective structure having predetermined electromagnetic characteristics, wherein the reflective structure includes a plurality of elements, wherein a first one of the elements is closer to a centerline of the corresponding photoelectric conversion element than any other of the elements, wherein the first one of the elements is an annular element that encloses an open center area, wherein the first one of the elements is within an area enclosed by a second one of the elements, wherein the first one of the elements is spaced apart from the second one of the elements, and wherein among the light incident on the photoelectric conversion layer, the reflective structure condenses and reflects light transmitted through each photoelectric conversion element of the photoelectric conversion layer at and to the photoelectric conversion element.

16. The solid-state imaging device according to claim 4, wherein the reflective structure is formed from at least one of a metal material or a dielectric material.

\*   \*   \*   \*   \*